(12) United States Patent
Fujiwara et al.

(10) Patent No.: US 7,392,463 B2
(45) Date of Patent: Jun. 24, 2008

(54) DATA REPRODUCING APPARATUS AVOIDING SELECTION OF INCORRECT PATH

(75) Inventors: Toru Fujiwara, Kato (JP); Katsuhiko Fukuda, Kato (JP); Akiyoshi Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 336 days.

(21) Appl. No.: 11/201,520

(22) Filed: Aug. 11, 2005

(65) Prior Publication Data
US 2005/0289445 A1 Dec. 29, 2005

Related U.S. Application Data

(63) Continuation of application No. PCT/JP03/007203, filed on Jun. 6, 2003.

(51) Int. Cl.
*H03M 13/03* (2006.01)
(52) U.S. Cl. .................. 714/796; 714/794; 714/795; 375/262; 375/341
(58) Field of Classification Search ......... 714/794–796; 375/262, 341
See application file for complete search history.

(56) References Cited

U.S. PATENT DOCUMENTS

| | | | | |
|---|---|---|---|---|
| 5,220,570 A | * | 6/1993 | Lou et al. | 714/791 |
| 6,108,811 A | * | 8/2000 | Nakamura et al. | 714/795 |
| 6,405,342 B1 | * | 6/2002 | Lee | 714/792 |
| 6,680,986 B1 | * | 1/2004 | Hemmati | 375/341 |
| 6,697,442 B1 | * | 2/2004 | Todoroki | 375/341 |
| 2002/0056744 A1 | | 5/2002 | Uchida et al. | |
| 2002/0174402 A1 | * | 11/2002 | Yamamoto | 714/795 |

FOREIGN PATENT DOCUMENTS

| | | |
|---|---|---|
| EP | 0 902 545 | 3/1999 |
| JP | 10-209882 | 8/1998 |
| JP | 2002-50134 | 2/2002 |
| JP | 2003-123400 | 4/2003 |
| JP | 2003-141820 | 5/2003 |
| WO | WO98/39848 | 9/1998 |

* cited by examiner

*Primary Examiner*—Jacques Louis-Jacques
*Assistant Examiner*—Esaw Abraham
(74) *Attorney, Agent, or Firm*—Greer, Burns & Crain, Ltd.

(57) ABSTRACT

An apparatus for reproducing data includes a branch metric computation unit and a plurality of parallel computation units. Each parallel computation unit includes path metric computation units that compute path metric values based on branch metric values. Path metric memories store the path metric values to be used in a next following path metric computation, and reliability computation units compute path reliability. Modified-path generating units generate an inverted path that is inverse to a path indicated by an output of the reliability computation units as having low reliability. If any one of the modified-path generating units generates the inverted path, a corresponding one of the path metric computation units stores a path metric value corresponding to the inverted path in a corresponding one of the path metric memories as a path metric value to be used in a next following path metric computation.

4 Claims, 10 Drawing Sheets

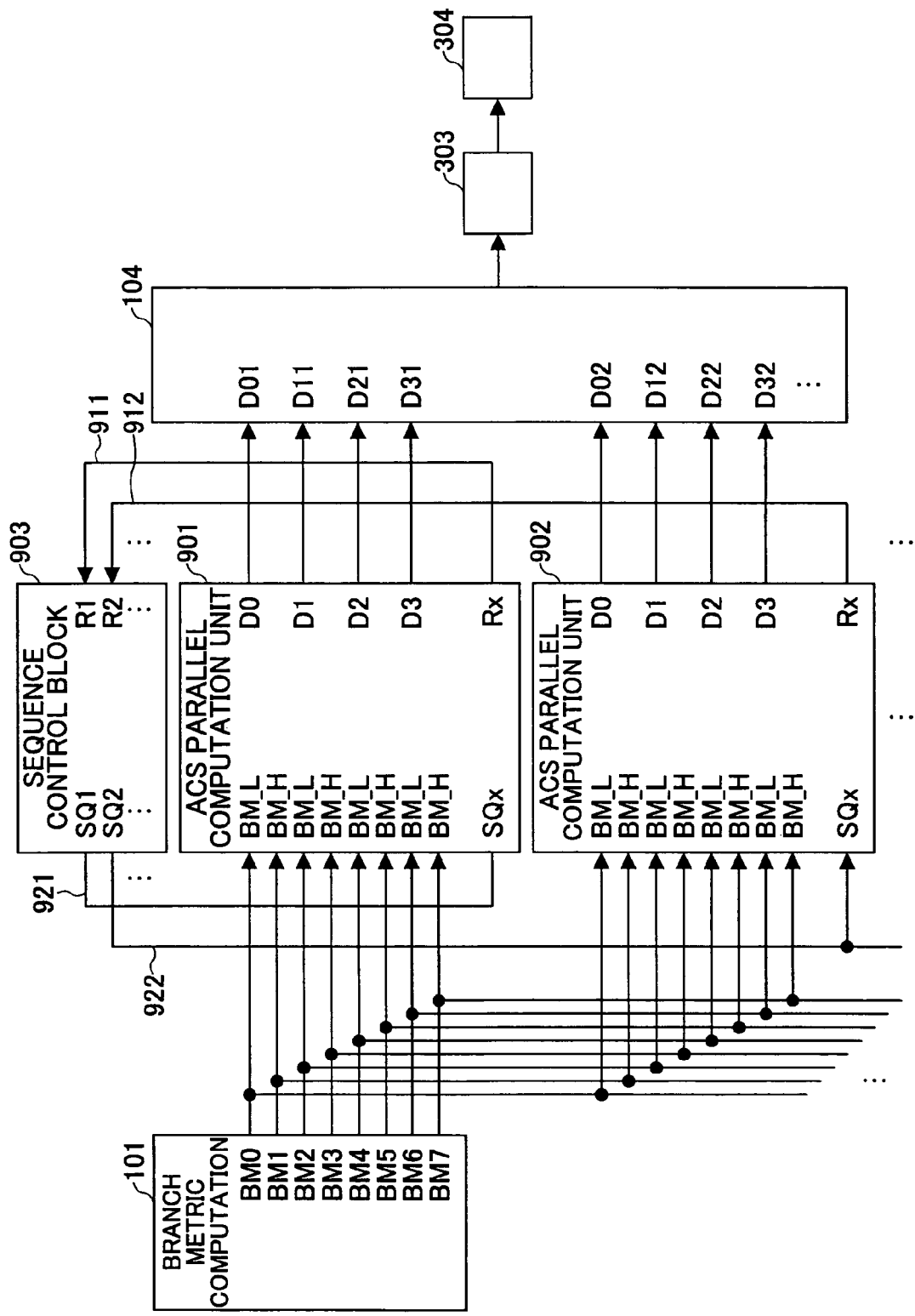

DATA REPRODUCING APPARATUS AVOIDING SELECTION OF INCORRECT PATH

CROSS-REFERENCE TO RELATED APPLICATION

This is a continuation of International Application No. PCT/JP2003/007203, filed on Jun. 6, 2003, the entire contents of which are hereby incorporated by reference.

BACKGROUND OF THE INVENTION

1. Field of the Invention

The present invention generally relates to data reproducing apparatuses that reproduce data recorded on a record medium such as an optical disk, and particularly relates to a data reproducing apparatus that reproduces data recorded on the record medium by use of a partial response (PR) method.

2. Description of the Related Art

Magneto-optical recording/reproducing apparatus, for example, is one type of data reproducing apparatus, and is used in various fields for the purpose of recording/reproducing image information, recording/reproducing various code data for computers, etc., because of its large capacity, exchangeability, high reliability, etc. Year after year, there has been an increasing demand for the provision of a larger capacity for such magneto-optical recording apparatus.

To satisfy such demand, data needs to be recorded on a record medium at high density, and the recorded data needs to be reproduced from the record medium with high precision. As a method of performing high-density data recording and high-precision reproducing, there has been proposed a method that modulates a record data signal into a partial response (PR) waveform for recording on an optical disk record medium, and samples a signal reproduced from the optical disk record medium at predetermined intervals, followed by detecting most likely data by use of a Viterbi detector (maximum likelihood data detector).

FIG. 1 is a drawing showing an example of a conventional Viterbi detector. A Viterbi detector 100 of FIG. 1 includes a branch metric computation unit (referred to as BM) 101, an add/compare/select unit (referred to as ACS) 102, a path metric memory (referred to as PMM) 103, and a path memory (referred to as PM) 104.

When the Viterbi detector 100 is applied to the data reproducing system of a magneto-optical disk apparatus, the BM 101 receives a sampling value yt with respect to a signal reproduced from the magneto-optical disk, and computes a branch metric value (BM value) that is a difference between the sampling value yt and an expected value. This expected value is dependent on a partial response waveform used at the time of data recording, and is the value that the reproduced signal is supposed to assume. The BM value is computed separately for each expected value when one sampling value yt is supplied to the BM 101.

The ACS 102 adds the BM value to a path metric value (PM value) of a preceding clock cycle stored in the PMM 103, and compares every two of the added PM values. Based on the result of this comparison, the ACS 102 selects a smaller one of the PM values as a new PM value, and stores the selected PM value in the PMM 103. As a result of such processes, the PM value becomes a cumulated sum of the BM values. The selecting of a smaller one as describe above is equivalent to the selecting of a state transition path. Namely, the ACS 102 always select a state transition path for which the PM value becomes minimum.

The PM 104 receives, from the ACS 102, data (binary data) corresponding to the selected path as described above. The PM 104 successively shifts the data corresponding to each selected path. While doing so, the PM 104 successively discards data corresponding each path if the path is decided not to be selected in view of the continuity of state transitions. The PM 104 outputs the data corresponding to the survived paths as detected data.

As described above, record data is modulated into a record signal having a partial response waveform, and the record signal is recorded on the magneto-optical disk, followed by detecting the most likely data by use of a Viterbi detector. This achieves highly-precise data reproduction with respect to a magneto-optical disk on which high-density recording was performed. Such recording/reproducing method is referred to as partial-response/maximum-likelihood decoding (hereinafter referred to as PRML).

FIG. 2 is a drawing showing an example of the operation of the conventional Viterbi decoder 100 shown in FIG. 1. At a time sequence 0, there are a branch 201 for transition from state 0 to state 0 and a branch 202 for transition from state 0 to state 1. In state 1, the computation as described above to select a smaller one of the PM values discards the branch 202 for transition from state 0 to state 1 at the time sequence 0, so that the branch 201 for transition from state 0 to state 0 survives. Then, there are a branch 203 for transition from state 0 to state 0 and a branch 204 for transition from state 0 to state 1.

In this manner, surviving paths are successively selected, resulting in the survival of a path 220. The PM 104 then outputs the data corresponding to the surviving paths as detected data.

During the computation of the BM values and PM values, however, there may be a branch having low reliability. Here, "low reliability" refers to a state in which the actual sample value is far away from any expected values. On the other hand, "high reliability" refers to a state in which the actual sample value is close to some expected value. Namely, the closer the actual sample value to some expected value, the higher the reliability of the sample value is. A sample value having low reliability has a high possibility of being incorrect.

There are various methods for improvement with respect to the Viterbi decoding method based on the Viterbi detector.

As an expanded configuration, for example, information about the position of a possibly incorrect branch according to the branch metric value of the ACS unit is recorded. At the time of selecting this possibly incorrect branch path, data obtained by selecting the other path is set aside as the second option for reproduction, the third option for reproduction, the fourth option for reproduction, etc. The individual options are compared and analyzed to select a right option, thereby reducing the possibility of error.

In this method, however, FIFO memory needs to be provided in large amount to store data for the data processing. Since the FIFO memory stores selected paths (Dm), other options (Rm), parity information (Pk), and option 1 (x1) for N bits, large circuit size becomes a problem.

In consideration of this problem, there is a method that obviates this problem by modifying the selected paths according to ACS.

FIG. 3 is a drawing showing an example of a conventional Viterbi detector 300 that modifies selected paths. The Viterbi detector 300 mainly includes the BM 101, the ACS 102, the PMM 103, a reliability computation block 301, a modified-path generating block 302, the PM 104, a parity computation block 303, and a correct-data selecting block 304. In FIG. 3, elements having the same numerals as those of FIG. 1 represent the same elements.

In the Viterbi detector 300 of FIG. 3, provision is made to cope with other options in numbers as many as the predetermined number. To this end, the reliability computation block 301 computes the degree of reliability based on the results of ACS within the data length defined by the path metric computation (i.e., within the data group to which parity is added). Based on this degree of reliability, the modified-path generating block 302 detects a branch path having lower reliability. The path that is inverted at the position of this selected path Dm is treated as an inversion option path.

FIG. 4 is a drawing showing the operation that inverts such inversion option. When FIG. 4 is compared with FIG. 2, a low reliability path 210 shown in FIG. 2 is a path for transition from state 0 to state 0 at a time sequence 9. In FIG. 4, on the other hand, an inversion is performed to take a path 401 for transition from state 1 to state 0 at the time sequence 9. Then, surviving paths are successively selected, resulting in the survival of the path 410.

Thereafter, a plurality of inversion option paths generated in this manner are stored in the PM 104. At the end, the parity computation block 303 checks errors, followed by the correct-data selecting block 304 outputting correct data among the plurality of inversion option paths.

The technology preceding the present invention may include the following Patent Documents.

[Patent Document 1] Japanese Patent Application Publication No. 10-209882

[Patent Document 2] Japanese Patent Application Publication No. 2002-50134

[Patent Document 3] Japanese Patent Application No. 2001-336802

The method of selecting a correct path from a plurality of inversion option paths has problems as follows.

The method of selecting a correct path from a plurality of inversion option paths checks reliability at the time of path metric computation, and generates an inversion option based on the computation results. If there is an inversion option, a corresponding portion in the path memory (PM) 104 is inverted.

Under normal circumstances, a path selected through computation by the ACS 102 matches the state of the path memory. When the method of selecting a correct path from a plurality of inversion option paths is used, the value computed by the ACS 102 after the inversion of an inversion option does not necessarily match the state of the path memory PM 104.

As a result, on the paths following the point where an inversion option is inverted, a path that is supposed to be selected may end up being not selected.

FIG. 5 is a drawing showing a case in which on the paths following the point where an inversion option is inverted, a path that is supposed to be selected ends up being not selected. When FIG. 2, FIG. 4, and FIG. 5 are compared, the low reliability path 210 at the time sequence 9 in FIG. 2 is inverted into the inversion path 401 at the time sequence 9 as shown in FIG. 4, resulting in a path 402 for transition from state 0 to state 0 at a time sequence 14 in FIG. 4 being inverted into a path 501 for transition from state 1 to state 0 at the time sequence 14 in FIG. 5. Then, surviving paths are successively selected, resulting in the survival of the path 510.

As such phenomenon occurs, if the decoded data includes 2-bit errors, for example, the parity computation block 303 may not be able to detect the errors by performing parity checks. Consequently, erroneous data may be output from the correct-data selecting block 304 as correct data, which contributes to an increase in the number of errors at the time of read operation.

The reason why the path metric computation value after inversion does not match the state of the path memory is as follows.

The formula for path metric computation is as follows.

$$PMm = \text{Min}\{PMi + BMj, PMk + BMl\} \quad (1)$$

Conventionally, data stored in the path memory PM 104 is such that the selected path Dm becomes 1 if the value of PMi+BMj, which is the first one of the contents of the parentheses "{ }", is selected as PMm in the above formula, and such that the selected path Dm becomes 0 if the value of PMk+BMl, which is the second one, is selected.

In the method of selecting a correct path from a plurality of inversion option paths, if the first value "PMi+BMj" and the second value "PMk+BMl" are close to each other, it is ascertained that reliability is low. In this case, "1" is stored in place of "0" in the path memory, and "0" is stored in place of "1".

In the method of selecting a correct path from a plurality of inversion option paths, no exchange is performed with respect to the path metric feedback values to be used next in order to compute the next path metric PMm.

Accordingly, if the first value "PMi+BMj" and the second value "PMk+BMl" are close to each other in the above formula (1), a path such as the path 501 at the time sequence 14 of FIG. 5 as described above may be selected due to the influence of path metric computation error generated by the lack of exchanging operations. This results in an increase in error.

SUMMARY OF THE INVENTION

It is a general object of the present invention to provide a data reproducing apparatus that substantially obviates one or more problems caused by the limitations and disadvantages of the related art.

It is another and more specific object of the present invention to provide a data reproducing apparatus that reproduces data recorded on a record medium by use of the partial response method without selecting an incorrect path due to the influence of path metric computation error.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a data reproducing apparatus particularly pointed out in the specification in such full, clear, concise, and exact terms as to enable a person having ordinary skill in the art to practice the invention.

To achieve these and other advantages in accordance with the purpose of the invention, the invention provides an apparatus for reproducing data which includes a sampling unit configured to sample a reproduced signal at predetermined intervals as the reproduced signal is obtained from a record medium according to a partial response waveform, a branch metric computation unit configured to compute branch metric values by use of a sample value and expected values determined by the partial response waveform according to a Viterbi decoding algorithm, and a plurality of parallel computation units, each of which includes a plurality of path metric computation units configured to compute path metric values based on the branch metric values, a plurality of path metric memories operable to store the path metric values to be used in a next following path metric computation, a plurality of reliability computation units configured to compute path reliability, and a plurality of modified-path generating units configured to generates an inverted path that is inverse to a path indicated by an output of the reliability computation units as having low reliability, wherein if any one of the modified-path generating units generates the inverted path, a corresponding one of the path metric computation units stores a path metric value corresponding to the inverted path in a corresponding one of the path metric memories as a path metric value to be used in a next following path metric computation.

According to at least one embodiment of the present invention, the data reproducing apparatus can reproduce data recorded on a record medium by use of the partial response method without selecting an incorrect path due to the influence of path metric computation error.

BRIEF DESCRIPTION OF THE DRAWINGS

Other objects and further features of the present invention will be apparent from the following detailed description when read in conjunction with the accompanying drawings, in which:

FIG. 9 is a drawing showing a Viterbi decoder that includes a plurality of ACS parallel computation units;

DESCRIPTION OF THE PREFERRED EMBODIMENTS

In the following, embodiments of the present invention will be described with reference to the accompanying drawings.

Figure 6:
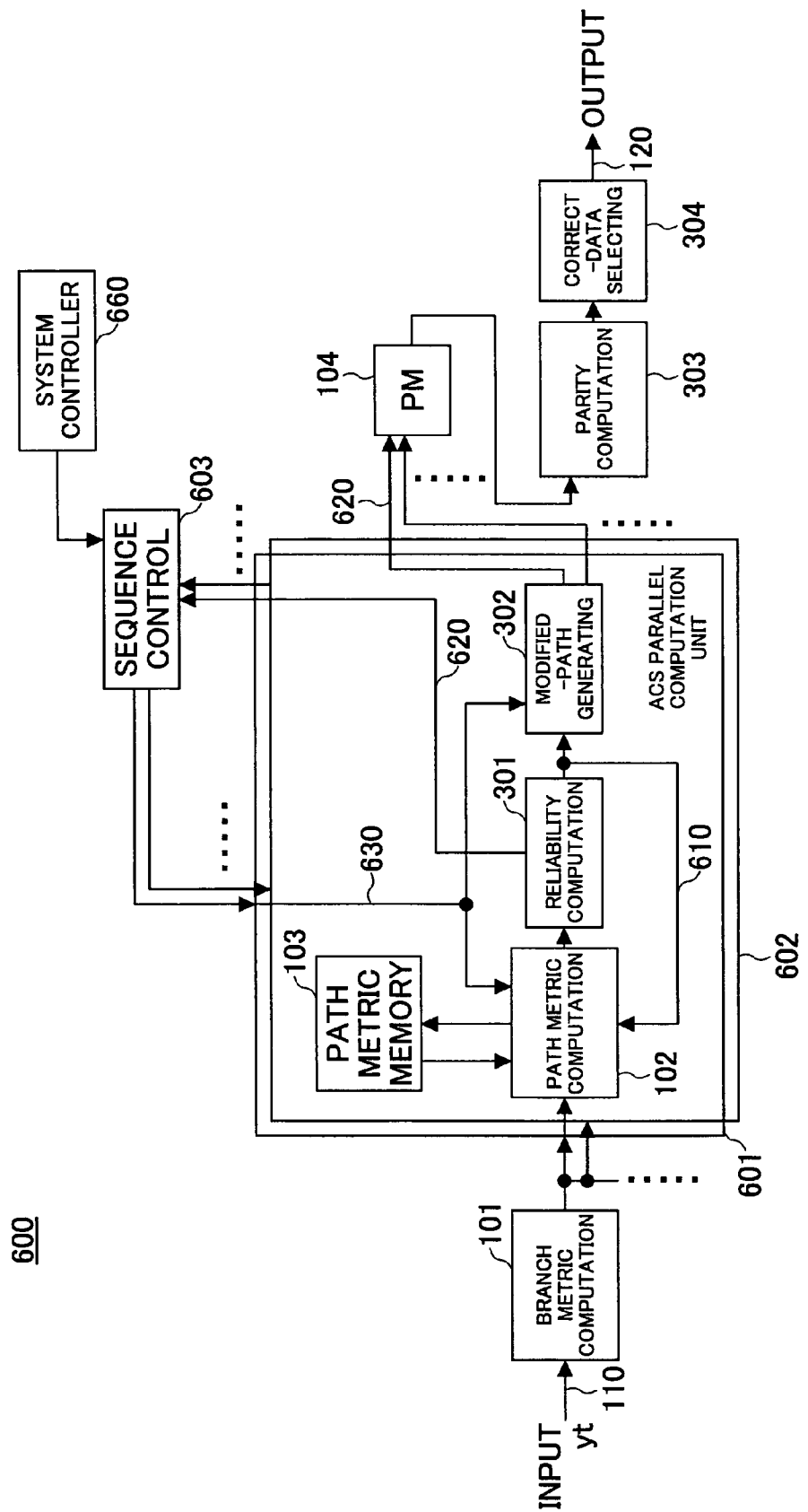
FIG. 6 is a drawing showing an embodiment of a Viterbi decoder illustrating the principle of the present invention.

The principle of the present invention will be described first. FIG. 6 is a drawing showing an embodiment of a Viterbi decoder 600 illustrating the principle of the present invention.

The Viterbi decoder 600 of FIG. 6 includes the branch metric computation unit (BM) 101, ACS parallel computation units 601, 602, and so on, the path memory PM 104, the parity computation block 303, the correct-data selecting block 304, a sequence control block 603, and a system controller 660. The ACS parallel computation unit 601 includes a plurality of ACSs (path metric computation units) 102, a plurality of PMMs 103, a plurality of reliability computation blocks 301, and a plurality of modified-path generating blocks 302. Each of the ACS parallel computation units 601, 602, and so on generate modified paths in parallel. The system controller 660 supplies control signals to the sequence control block 603.

In each of the ACS parallel computation units 601, 602, and so on, the reliability computation block 301 provides a control signal to the ACS 102. In each of the ACS parallel computation units 601, 602, and so on, the reliability computation block 301 provides a control signal to the sequence control block 603. Further, the sequence control block 603 provides a control signal to the ACS 102 of each of the ACS parallel computation units 601, 602, and so on.

Figure 1:
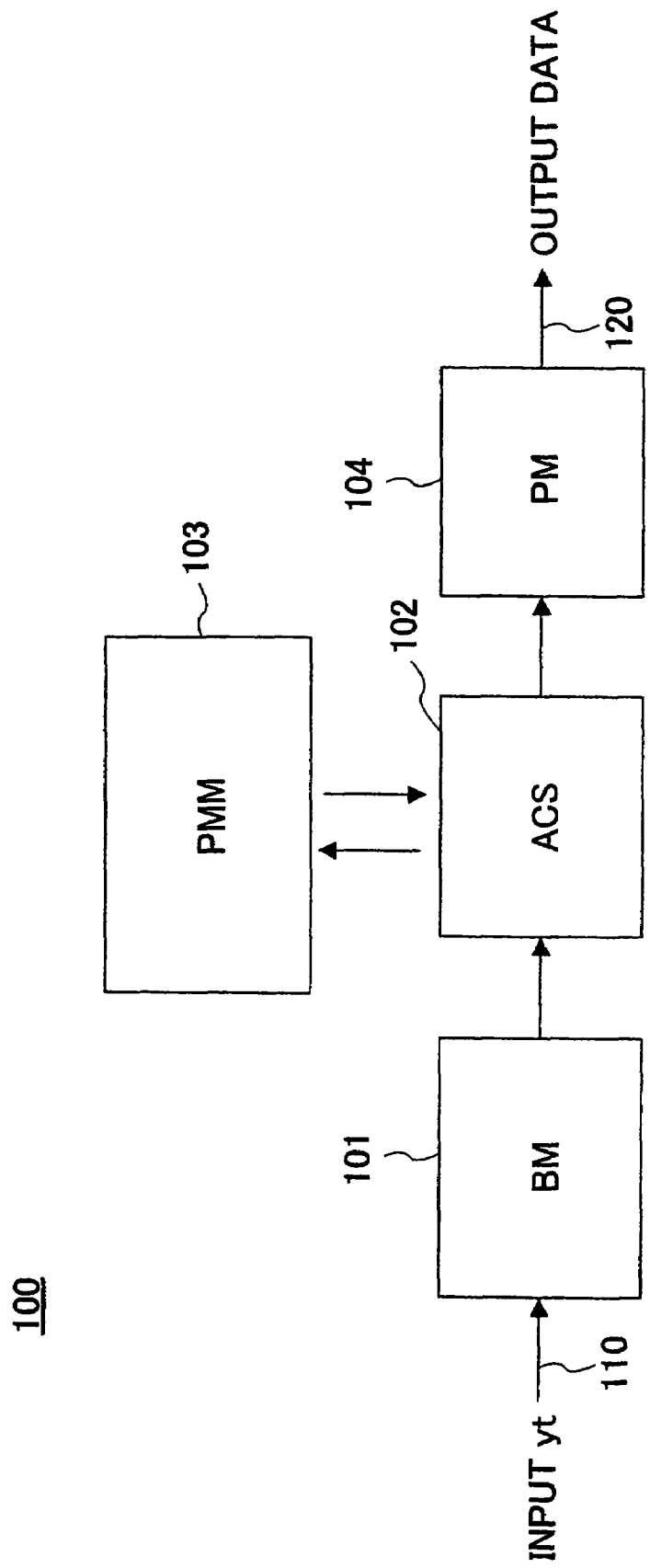
FIG. 1 is a drawing showing an example of a conventional Viterbi detector.
Figure 2:
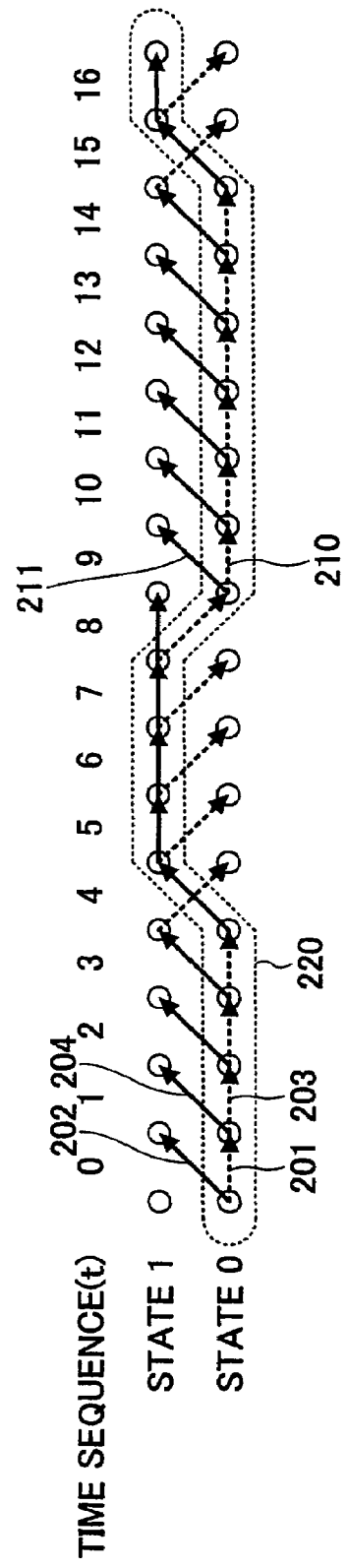
FIG. 2 is a drawing showing an example of the operation of the conventional Viterbi decoder shown in FIG. 1.
Figure 3:
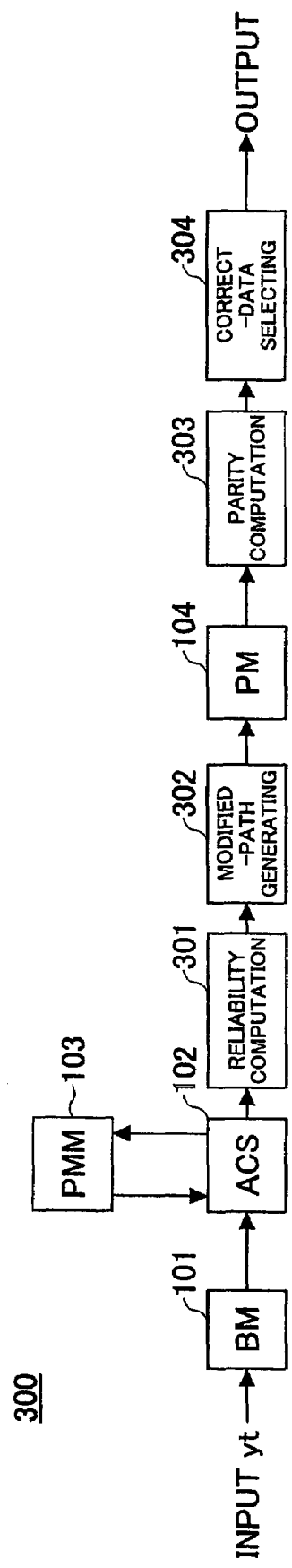
FIG. 3 is a drawing showing an example of a conventional Viterbi detector that modifies selected paths.
Figure 4:
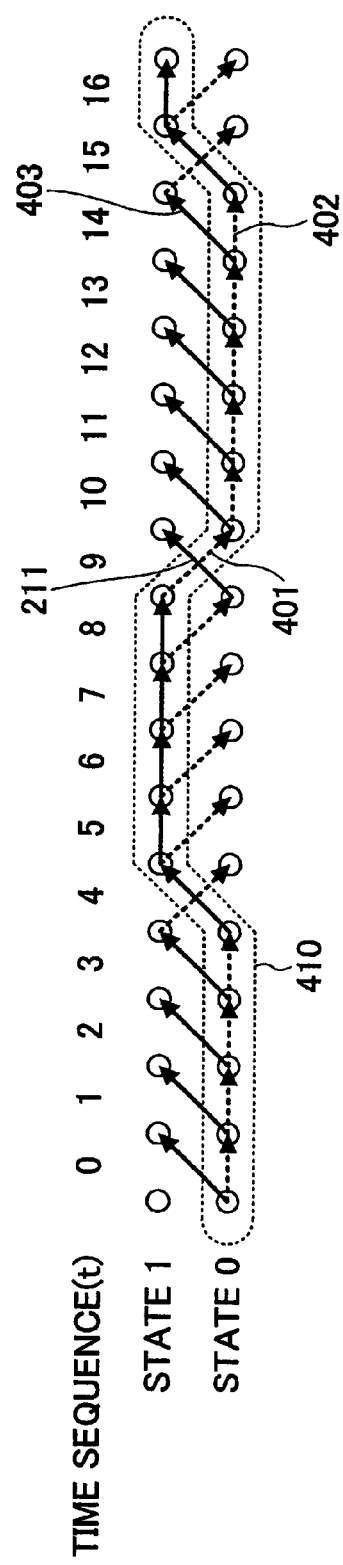
FIG. 4 is a drawing showing the operation that inverts an inversion option.
Figure 5:
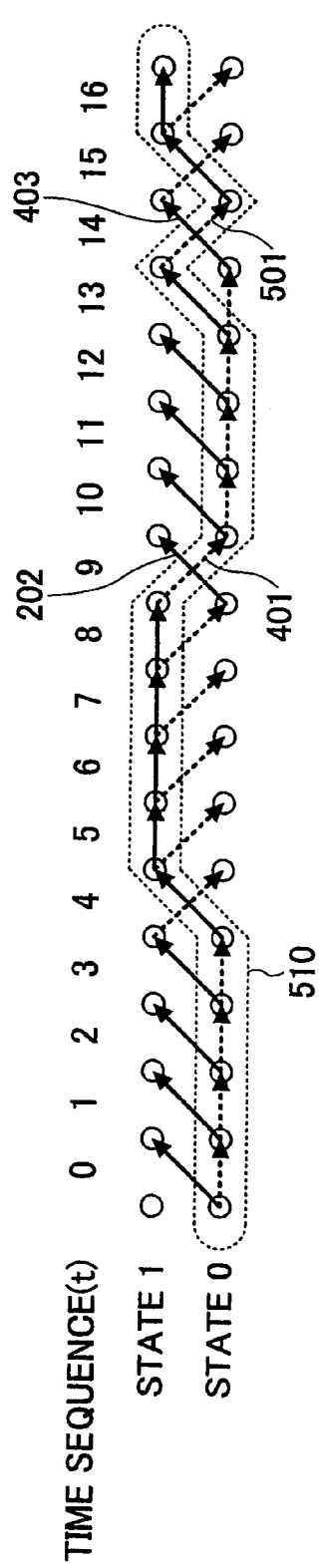
FIG. 5 is a drawing showing a case in which on the paths following the point where an inversion option is inverted, a path that is supposed to be selected ends up being not selected.

In FIG. 6, the BM 101, each ACS 102, and each PMM 103 operate in the same manner as in the configuration shown in FIG. 1 and FIG. 3.

Each reliability computation block 301 computes the degree of reliability DRm as follows.

$$\text{If } |(PMi+BMj)-(PMk+BMl)| < J-PM, DRm=0 \quad (2)$$

$$\text{If } |(PMi+BMj)-(PMk+BMl)| \geq J-PM, DRm=1 \quad (3)$$

Here, the value "J–PM" is a predetermined path metric (PM) check value.

If the degree of reliability DRm=1 (i.e., if the degree of reliability is high), the modified-path generating block 302 does not generate a modified path, and outputs the value of the selected path Dm to the path memory PM 104 without any change. In this case, further, information indicative of the high degree of reliability is transmitted to the ACS 102 through a signal 610 and to the sequence control block 603 through a signal 620. In this case, thus, the path metric is represented as:

$$PMm=\text{Min}\{PMi+BMj, PMk+BMl\} \quad (4).$$

This value is stored in the PMM 103 for use in the next ACS computation.

If the degree of reliability DRm=0 (i.e., if the degree of reliability is low), the modified-path generating block 302 inverts the value of the selected path Dm for provision to the path memory PM 104. In this case, further, information indicative of the low degree of reliability is transmitted to the ACS 102 through the signal 610 and to the sequence control block 603 through the signal 620. In this case, thus, the path metric is represented as:

$$PMm=\text{Max}\{PMi+BMj, PMk+BMl\} \quad (5).$$

This value is stored in the PMM 103 for use in the next ACS computation.

The computation as described above is performed in parallel by the ACS parallel computation units 601, 602, and so on. The value of the selected path Dm or the inverted value of the selected path Dm is stored in the path memory PM 104.

In each of the ACS parallel computation units 601, 602, and so on, sequence control is performed by the sequence control block 603 as will later be described with reference to FIG. 7.

At the end, the parity computation block 303 checks errors, and, then, the correct-data selecting block 304 selects correct data from the plurality of paths stored in the path memory PM 104 for provision as an output.

Figure 7:
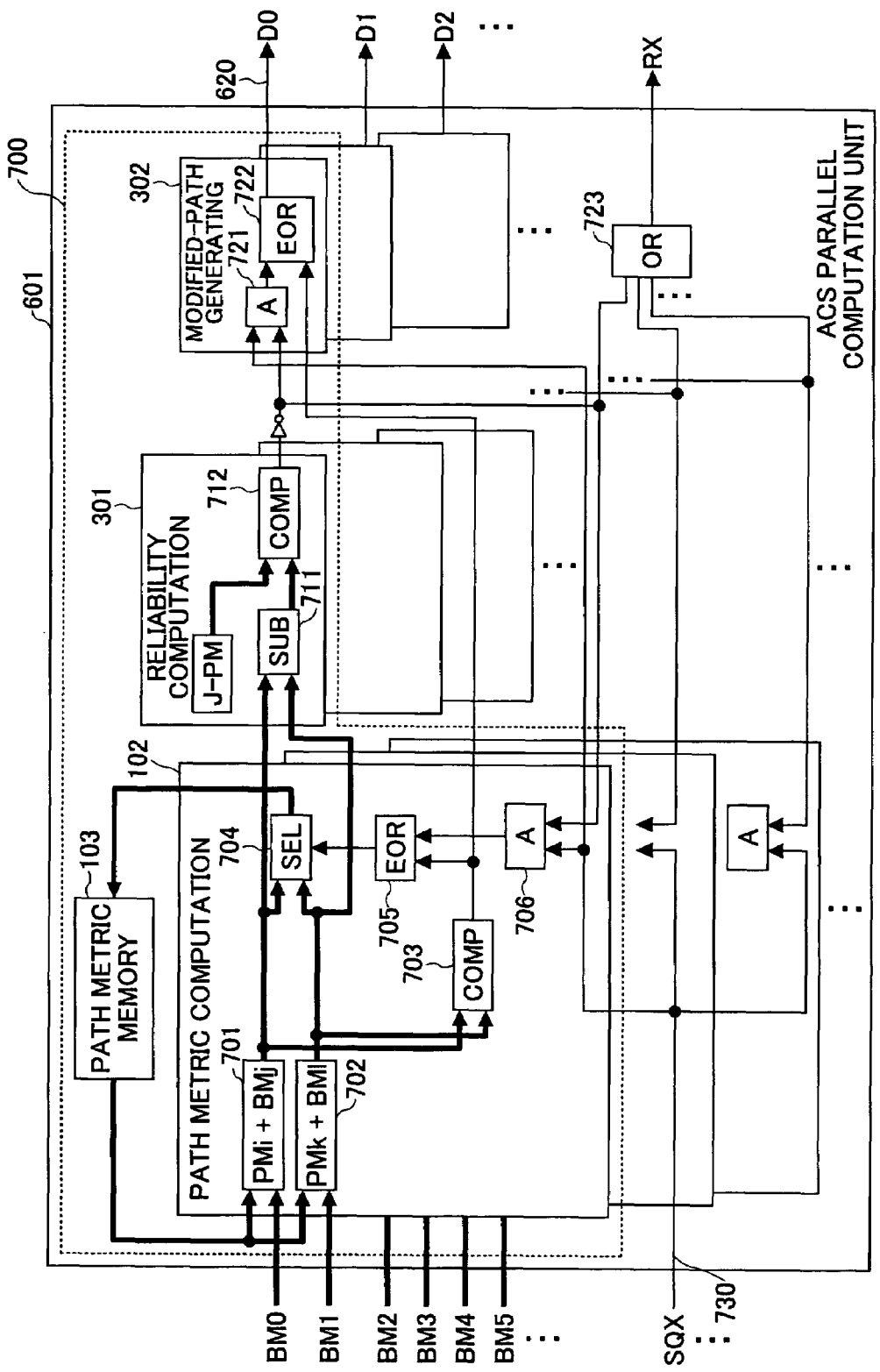
FIG. 7 is a drawing showing the detailed configuration of an ACS parallel computation unit of the Viterbi decoder shown in FIG. 6.

FIG. 7 is a drawing showing the detailed configuration of the ACS parallel computation unit 601 of the Viterbi decoder 600 shown in FIG. 6.

BM0, BM1, and so on are branch metric computation values computed by the branch metric computation unit 101. In this embodiment, when the 3-value 4-state PRML is used as an example, there are 8 BMs including BM0 through BM7. Pairs of BM0 and BM1, BM2 and BM3, BM4 and BM5, and BM6 and BM7 are used in the respective path metric computations 102 of the ACS parallel computation unit 601.

The ACS parallel computation unit 601 includes a plurality of ACSs 102, a plurality of PMMs 103, a plurality of reliability computation blocks 301, and a plurality of modified-path generating blocks 302. The first ACS 102 receives the branch metrics BM0 and BM1 computed by the branch metric computation unit (BM) 101. The second ACS 102 receives BM2 and BM3, the third ACS 102 receiving BM4 and BM5, and the fourth ACS 102 receiving BM6 and BM7.

In the following, a description will be given of the operation of the first ACS 102, reliability computation block 301, and modified-path generating block 302, which are indicated as a portion 700 enclosed by dotted lines in FIG. 7.

The ACS (path metric computation unit) 102 includes a PMi+BMj computation unit 701, a PMk+BMl computation unit 702, a comparison unit 703, a selecting unit 704, an exclusive-OR gate 705, and an AND gate 706 among the path metric computation. The reliability computation block 301 includes a subtraction unit 711 and a comparison unit 712. The modified-path generating block 302 includes an AND gate 721 and an exclusive-OR gate 722.

The PMi+BMj computation unit 701 computes and outputs a path metric PMi+BMj. The PMk+BMl computation unit 702 computes and outputs a path metric PMk+BMl.

The comparison unit 703 compares the output of the PMi+BMj computation unit 701 with the outputs of the PMk+BMl computation unit 702.

The subtraction unit 711 of the reliability computation block 301 subtracts PMk+BMl from PMi+BMj, and obtains an absolute value thereof. The comparison unit 712 then compares the output of the subtraction unit 711 with the value "J−PM", which is a predetermined path metric (PM) check value.

As shown in the formula (2) previously described, if the output of the subtraction unit 711 is smaller than the value "J−PM", it is ascertained that reliability is low. As shown in the formula (3) previously described, on the other hand, if the output of the subtraction unit 711 is equal to or larger than the value "J−PM", it is ascertained that reliability is high.

Figure 11:
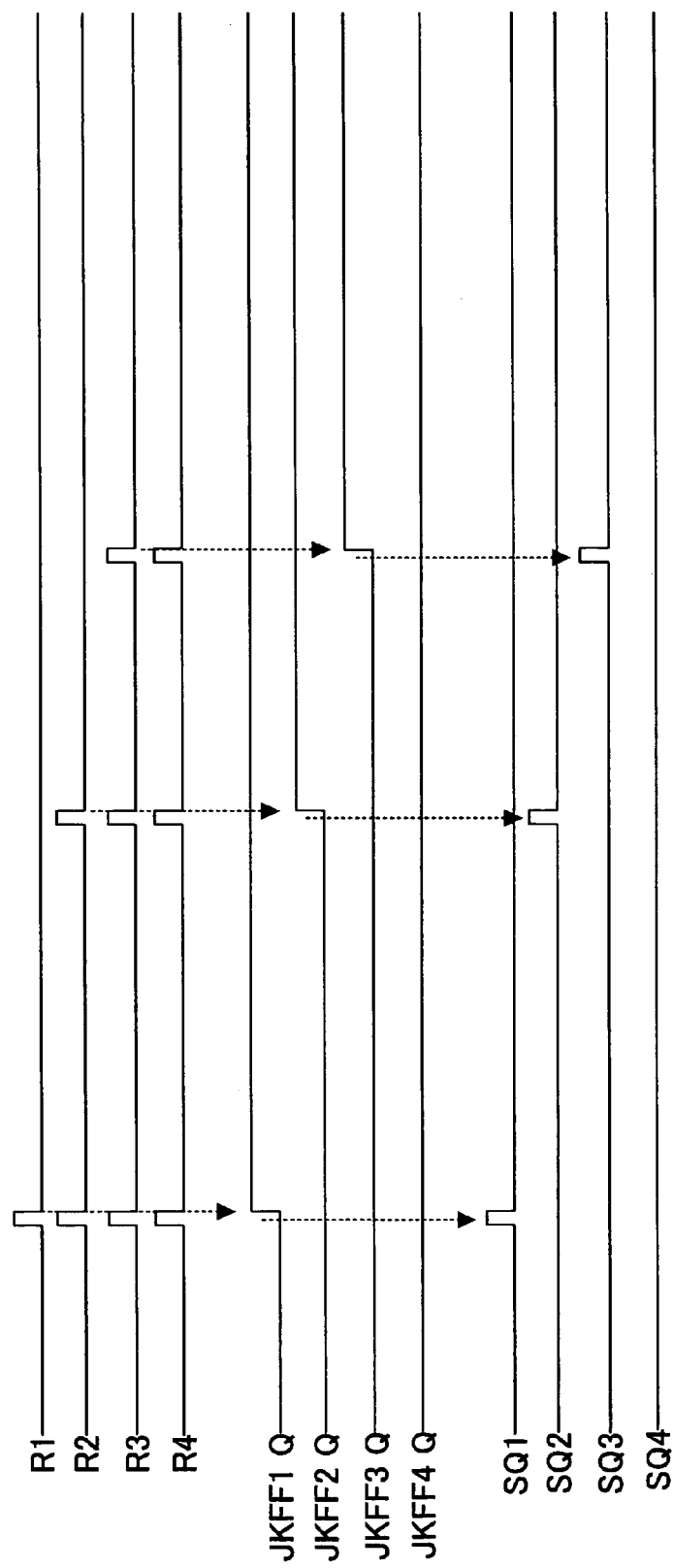
FIG. 11 is a drawing showing operation timings and the timing of sequence control performed by the sequence control block.

In the case where the reliability of the path is high, a control signal 730 from the sequence control block 603 is not set to a high level. This is because when reliability is high, the inverter output always assumes a low level, which passes through an OR gate 723, and SQ1 is not asserted unless R1 is asserted as shown in FIG. 11. As a result, the AND gate 706 does not asserts its output. When reliability is high, thus, the exclusive-OR gate 705 provides a selection signal to the selecting unit 704 without inverting the output of the comparison unit 703. As s result, the selecting unit 704 selects the smaller of "PMi+BMj" or "PMk+BMl" as a path metric PMm as shown in the formula (4) previously described. At the same time, in the modified-path generating block 302, the exclusive-OR gate 722 supplies the output of the comparison unit 703 to the path memory PM 104 without inverting the path.

In the case where the reliability of the path is low, the output of the comparison unit 712 is set to a low level, with the inverter output being set to a high level. The output of the OR gate 723 is set to the high level. As shown in FIG. 11, SQ1 is set to the high level (pulse output) with respect to R1 when reliability is low, resulting in the output of the AND gate 706 being set to the high level, at which time the exclusive-OR gate 705 supplies the selection signal to the selecting unit 704 by inverting the output of the comparison unit 703. As a result, the selecting unit 704 selects the larger of "PMi+BMj" or "PMk+BMl" as a path metric PMm as shown in the formula (5) previously described. At the same time, in the modified-path generating block 302, the exclusive-OR gate 722 inverts the output of the comparison unit 703 for provision to the path memory PM 104 in order to invert the path.

The signal 730 supplied from the sequence control block 603 is an inversion permitting signal (SQX) that serves to prevent the ACS parallel computation unit 601 from performing an inversion a second time after it performs an inversion once.

The OR gate 723 in the ACS parallel computation unit 601 performs such control that if any Dm (m=0, 1, 2, 3 in this example) is modified, the ACS parallel computation unit 601 with the modified Dm cannot perform modification again.

The operations of the second, third, and fourth ACSs 102, reliability computation blocks 301, and modified-path generating blocks 302 are the same as what has been described above.

Figure 8A:
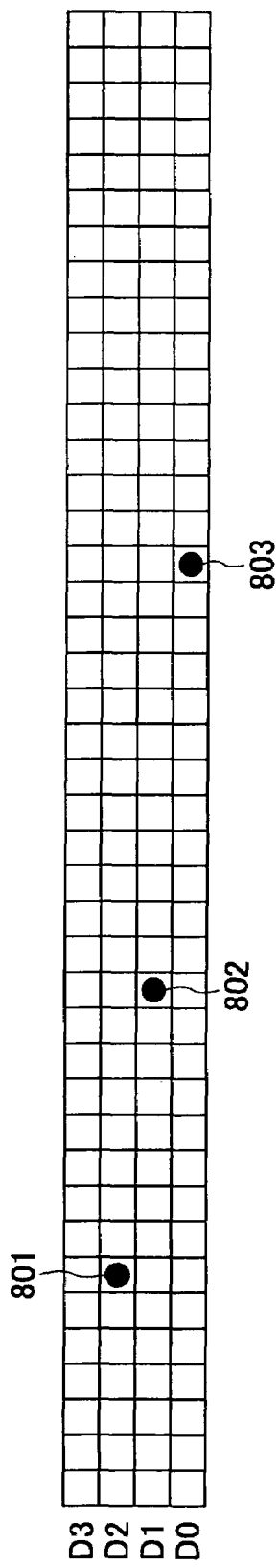
FIG. 8A is a drawing showing a case in which a plurality of low reliability paths are present in the data length defined by a single path metric computation.

FIG. 8A is a drawing showing a case in which a plurality of low reliability paths are present in the data length defined by a single path metric computation as described above. In FIG. 8A, a solid circle 801 indicates a low reliability path that is in existence on the paths computed by using the branch metrics BM4 and BM5. A solid circle 802 indicates a low reliability path that is in existence on the paths computed by using the branch metrics BM2 and BM3. A solid circle 803 indicates a low reliability path that is in existence on the paths computed by using the branch metrics BM0 and BM1.

FIG. 9 is a drawing showing a Viterbi decoder 900 that includes a plurality of ACS parallel computation units 901, 902, and so on.

Low reliability paths are computed by each reliability computation block 301 in the ACS parallel computation units 901, 902, and so on of the Viterbi decoder 900 shown in FIG. 9, and are subjected to logic sum processing by the OR gate 723 shown in FIG. 7. The positions of such low reliability paths are supplied to a sequence control block 903 via signals 911 and 912.

The sequence control block 903 uses signals 921 and 922 to control the timing at which the operation of the ACS parallel computation units 901, 902, and so on starts.

FIG. 11 is a drawing showing operation timings. FIG. 11 also illustrates the timing of sequence control performed by the sequence control block 603. R1, R2, R3, and R4 are output by the ACS parallel computation units 901, 902, and so on, and correspond to the positions of low reliability paths. Namely, R1 corresponds to the solid circle 801 of FIG. 8A, R2 to the solid circle 802 of FIG. 8A, and R3 to the solid circle 803 of FIG. 8A.

SQ1, SQ2, SQ3, and SQ4 are timing signals that indicate the timing at which inversion is permitted in the ACS parallel computation units 901, 902, and so on. In the ACS parallel computation units 901, 902, and so on, the AND gates 706 and 721 in FIG. 7 are placed in the state to allow an inversion when SQ1, SQ2, SQ3, and SQ4 being at the high level are supplied. Only when reliability is low, do the exclusive-OR gates 705 and 722 perform an inversion.

Figure 8B:
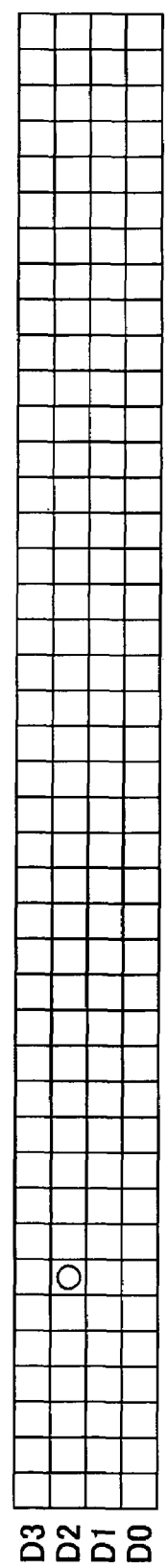
FIG. 8B is a drawing showing the operation of the first ACS parallel computation unit.

FIG. 8B is a drawing showing the operation of the first ACS parallel computation unit 901. The first ACS parallel computation unit 901 generates an inverted path indicated by the open circle with respect to the low reliability path indicated by the solid circle 801. According to the SQ1 signal output from the sequence control block 903, no operation is performed with respect to any low reliability path that may appear thereafter.

Figure 8C:
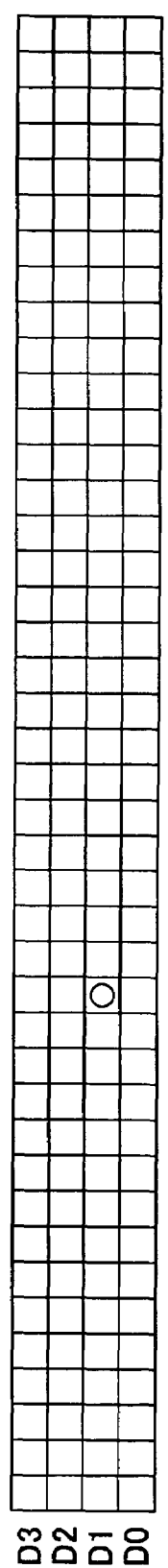
FIG. 8C is a drawing showing the operation of a second ACS parallel computation unit.

FIG. 8C is a drawing showing the operation of the second ACS parallel computation unit 902. The first ACS parallel computation unit 902 generates an inverted path indicated by the open circle with respect to the low reliability path indicated by the solid circle 802. According to the SQ2 signal output from the sequence control block 903, no operation is performed with respect to any low reliability path that may appear thereafter.

Figure 8D:
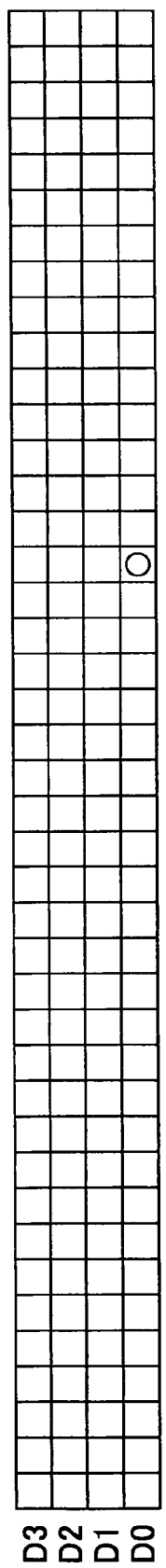
FIG. 8D is a drawing showing the operation of a third ACS parallel computation unit.

FIG. 8D is a drawing showing the operation of the third ACS parallel computation unit. The third ACS parallel computation unit generates an inverted path indicated by the open circle with respect to the low reliability path indicated by the solid circle 803. According to the SQ3 signal output from the sequence control block 903, no operation is performed with respect to any low reliability path that may appear thereafter.

Figure 8E:
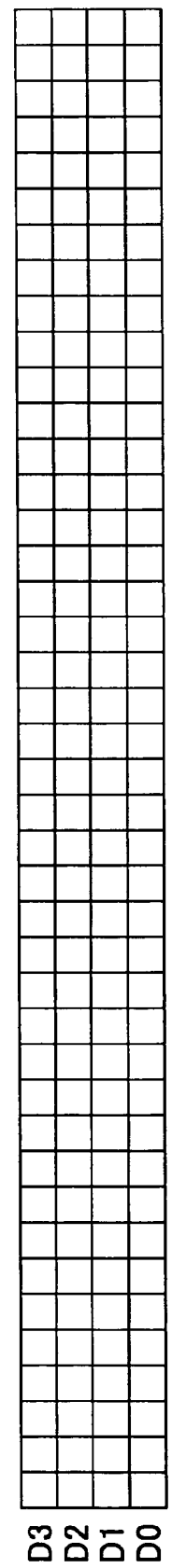
FIG. 8E is a drawing showing the operation of a fourth ACS parallel computation unit.

FIG. 8E is a drawing showing the operation of the fourth ACS parallel computation unit. Since there is no more low reliability path, the SQ3 signal output from the sequence control block 903 is not set to the high level. The fourth ACS parallel computation unit does not operate with respect to any low reliability path.

Figure 10:
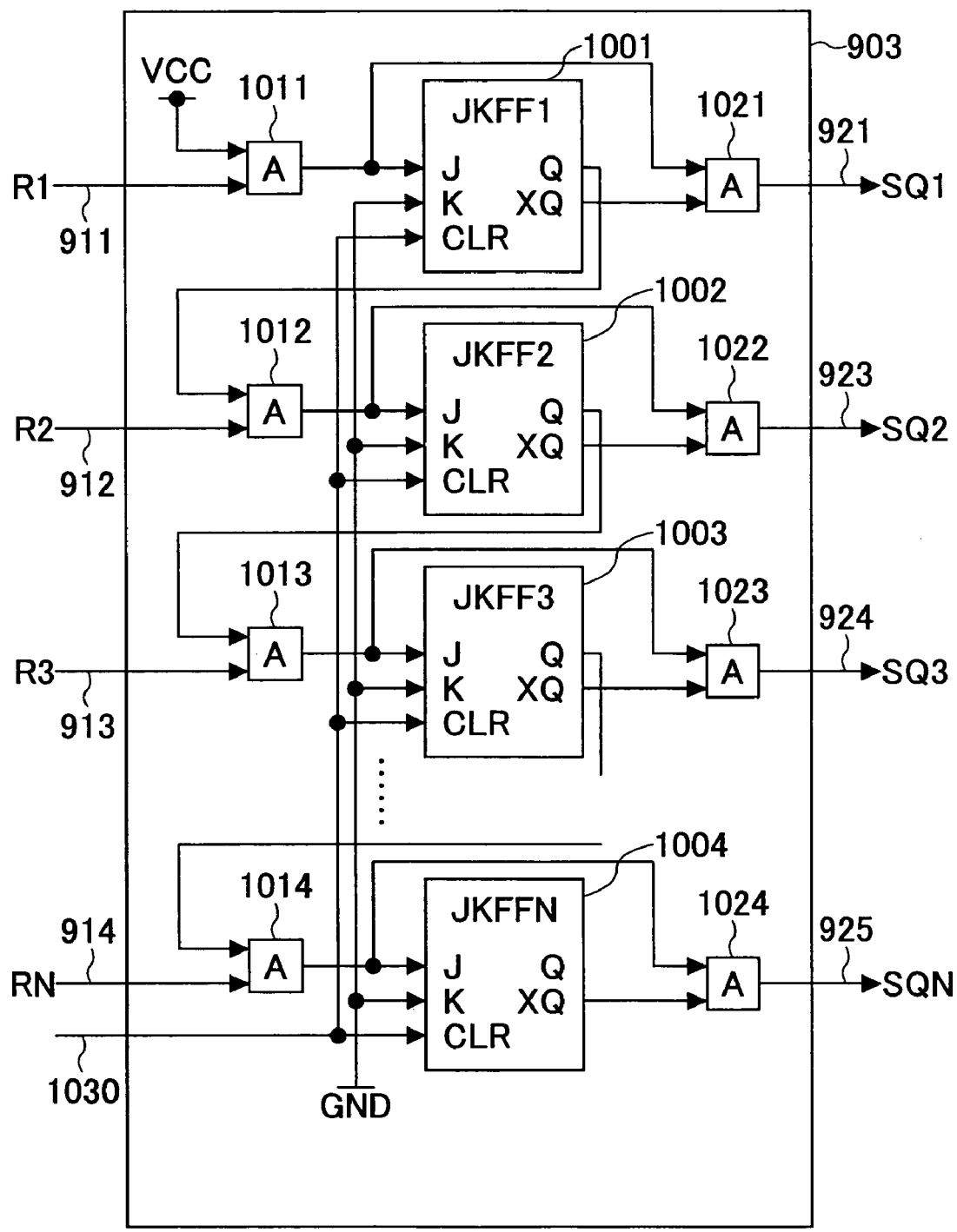
FIG. 10 is a drawing showing an embodiment of a sequence control block.

In the following, a description will be given of an embodiment of the sequence control block 903 shown in FIG. 9. FIG. 10 is a drawing showing an embodiment of the sequence control block 903. The sequence control block 903 shown in FIG. 10 mainly includes JK flip-flops 1001 through 1004, AND gats 1011 through 1014, and AND gates 1021 through 1024.

An enable signal 1030 input into the sequence control block 903 is supplied from the system controller 660 shown in FIG. 6. Further, the R1 signal, R2 signal, R3 signal, . . . , and RN signal are supplied from the ACS parallel computation units 901, 902, and so on. Moreover, the SQ1 signal, SQ2 signal, SQ3 signal, . . . , and SQN signal are output to the ACS parallel computation units 901, 902, and so on.

The R1 signal is input into the J input node of the JK flip-flop 1001 via the AND gate 1011, and the Q output of the JK flip-flop 1001 changes from a low level to a high level in response to a fall of the R1 signal as illustrated as JKFF1Q in FIG. 11. A pulse thus appears in the SQ1 signal.

By the same token, the R2 signal is input into the J input node of the JK flip-flop 1002 via the AND gate 1012, and the Q output of the JK flip-flop 1002 changes from a low level to a high level in response to a fall of the R2 signal as illustrated as JKFF2Q in FIG. 11. A pulse thus appears in the SQ2 signal.

By the same token, the R3 signal is input into the J input node of the JK flip-flop 1003 via the AND gate 1013, and the Q output of the JK flip-flop 1003 changes from a low level to a high level in response to a fall of the R3 signal as illustrated as JKFF3Q in FIG. 11. A pulse thus appears in the SQ3 signal.

On the other hand, the RN (R4) signal, which is input into the J input node of the JK flip-flop 1004 via the AND gate 1014, is not in a pulse form. As a result, the Q output of the JK flip-flop 1004 does not change as illustrated as JKFF4Q in FIG. 11. A pulse thus does not appear in the SQ4 signal.

The enable signal 1030 input into the sequence control block 903 may alternatively be a signal indicative of the read timing of the data reproducing system.

According to the present invention, it is possible to provide a data reproducing apparatus that reproduces data recorded on a record medium by use of the partial response method without selecting an incorrect path due to the influence of path metric computation error. This helps to reduce errors in the data that is reproduced by the data reproducing apparatus.

Further, the present invention is not limited to these embodiments, but various variations and modifications may be made without departing from the scope of the present invention.

What is claimed is:

1. An apparatus for reproducing data, comprising:
a sampling unit configured to sample a reproduced signal at predetermined intervals as the reproduced signal is obtained from a record medium according to a partial response waveform;
a branch metric computation unit configured to compute branch metric values by use of a sample value and expected values determined by the partial response waveform according to a Viterbi decoding algorithm; and
a plurality of parallel computation units, each of which includes a plurality of path metric computation units configured to compute path metric values based on the branch metric values, a plurality of path metric memories operable to store the path metric values to be used in a next following path metric computation, a plurality of reliability computation units configured to compute path reliability, and a plurality of modified-path generating units configured to generate an inverted path that is inverse to a path indicated by an output of the reliability computation units as having low reliability,
wherein with respect to the inverted path that any one of the modified-path generating units generates, a corresponding one of the path metric computation units stores a path metric value corresponding to the inverted path in a corresponding one of the path metric memories to exchange path metric feedback values with each other that are to be used in a next following path metric computation.

2. The apparatus as claimed in claim 1, wherein if one of the modified-path generating units in a given one of the parallel computation units generates the inverted path once, the modified-path generating units in said given one of the parallel computation units are not to generate an inverted path a second time.

3. The apparatus as claimed in claim 1, wherein one of said path metric computation units is configured to select a minimum path metric value if a corresponding one of the modified-path generating units does not generate the inverted path, and to select a maximum path metric value if the corresponding one of the modified-path generating units generates the inverted path.

4. An apparatus for reproducing data, comprising:
a sampling unit configured to sample a reproduced signal at predetermined intervals as the reproduced signal is obtained from a record medium according to a partial response waveform;
a branch metric computation unit configured to compute branch metric values by use of a sample value and expected values determined by the partial response waveform according to a Viterbi decoding algorithm; and
a plurality of parallel computation units, each of which includes a plurality of path metric computation units configured to compute path metric values based on the branch metric values, a plurality of path metric memories operable to store the path metric values to be used in a next following path metric computation, a plurality of reliability computation units configured to compute path reliability, and a plurality of modified-path generating units configured to generate an inverted path that is inverse to a path indicated by an output of the reliability computation units as having low reliability, wherein with respect to the inverted path that any one of the modified-path generating units generate, a corresponding one of the path metric computation units stores a path metric value corresponding to the inverted path in a corresponding one of the path metric memories to exchange path metric feedback values with each other that are to be used in a next following path metric computation; and a sequence control unit configured to control the plurality of parallel computation units such that if one of the modified-path generating units in a given one of the parallel computation units generates the inverted path once, the modified-path generating units in said given one of the parallel computation units are not to generate an inverted path a second time.

* * * * *